United States Patent
Pyun et al.

(10) Patent No.: US 12,405,421 B2
(45) Date of Patent: Sep. 2, 2025

(54) REFRACTIVE INDEX CONTRAST POLYMERS AND METHODS FOR PRODUCING AND USING THE SAME

(71) Applicant: Arizona Board of Regents on Behalf of the University of Arizona, Tucson, AZ (US)

(72) Inventors: Dong-Chul "Jeffrey" Pyun, Tucson, AZ (US); Robert A. Norwood, Tucson, AZ (US); Julie Ilana Frish, Tucson, AZ (US); Tristan Stephen Kleine, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 316 days.

(21) Appl. No.: 18/043,630

(22) PCT Filed: Aug. 31, 2021

(86) PCT No.: PCT/US2021/048536
§ 371 (c)(1),
(2) Date: Mar. 1, 2023

(87) PCT Pub. No.: WO2022/051303
PCT Pub. Date: Mar. 10, 2022

(65) Prior Publication Data
US 2023/0258864 A1    Aug. 17, 2023

Related U.S. Application Data

(60) Provisional application No. 63/073,232, filed on Sep. 1, 2020.

(51) Int. Cl.
G02B 6/122    (2006.01)
G02B 6/138    (2006.01)
(Continued)

(52) U.S. Cl.
CPC .......... *G02B 6/1221* (2013.01); *G02B 6/138* (2013.01); *G03F 7/0046* (2013.01); *G03F 7/027* (2013.01)

(58) Field of Classification Search
CPC ........ G02B 6/12; G02B 6/1221; G02B 6/138; G03F 7/0046; G03F 7/027
See application file for complete search history.

(56) References Cited

U.S. PATENT DOCUMENTS

| | | | |
|---|---|---|---|
| 5,239,026 A | 8/1993 | Babirad et al. | |
| 7,956,011 B2 * | 6/2011 | Serafinowski | ....... B01J 19/0046 506/13 |

(Continued)

OTHER PUBLICATIONS

International Search Report and Written Opinion mailed Nov. 17, 2021 for International Patent Application No. PCT/US2021/048536 (9 pages).

(Continued)

*Primary Examiner* — Tina Wong
(74) *Attorney, Agent, or Firm* — Perkins Coie LLP

(57) ABSTRACT

The present invention is directed to refractive index contrast ("RIC") polymers and methods for producing and using the same. In one particular embodiment, RIC polymers of the invention can be used as waveguides. RIC polymers of the invention are produced from a monomeric mixture comprising a first monomer and a second monomer comprising an acid-labile protecting group, where a first polymer produced from the first monomer has a different refractive index compared to the refractive index of a second polymer produced from the second monomer. The base refractive index of RIC polymers can be tuned by controlling the amount of the first and the second monomers. Furthermore, the refractive index of the waveguide can be modulated by the amount of acid-labile protecting group removal.

20 Claims, 9 Drawing Sheets

(51) Int. Cl.
    *G03F 7/004*         (2006.01)
    *G03F 7/027*         (2006.01)

(56) References Cited

U.S. PATENT DOCUMENTS

| | | |
|---|---|---|
| 2002/0064896 A1 | 5/2002 | Zhao et al. |
| 2004/0219452 A1 | 11/2004 | Rhodes et al. |
| 2009/0270279 A1 | 10/2009 | Serafinowski et al. |
| 2019/0206136 A1 | 7/2019 | West et al. |

OTHER PUBLICATIONS

P.G.M. Wuts, Green's Protective Groups in Organic Synthesis, 5th edition, John Wiley & Sons, New York, 2014 (see onlinelibrary.wiley.com/doi/book/10.1002/9781118905074), Table of Contents Included.

Smith, Michael B., Compendium of Synthetic Organic Methods, vols. 1-13 (John Wiley and Sons, 1971-2014), Table of Contents Included.

\* cited by examiner

REFRACTIVE INDEX CONTRAST POLYMERS AND METHODS FOR PRODUCING AND USING THE SAME

CROSS-REFERENCE TO RELATED APPLICATIONS

This patent document is a 371 National Phase Application of International Patent Application No. PCT/US2021/048536, filed Aug. 31, 2021, which claims the priority benefit of U.S. Provisional Application No. 63/073,232, filed Sep. 1, 2020. The entire contents of the above noted applications are incorporated herein by reference as part of the disclosure of this document.

STATEMENT REGARDING FEDERALLY FUNDED RESEARCH

This invention was made with government support under Grant No. FA8650-15-2-5220 awarded by Air Force Material Command. The government has certain rights in the invention.

FIELD OF THE INVENTION

The present invention is directed to refractive index contrast ("RIC") polymers and methods for producing and using the same. The RIC polymers of the invention are particularly useful as waveguides. In particular, the refractive index contrast polymers of the invention are produced from a monomeric mixture comprising a first monomer and a second monomer comprising an acid-labile protecting group, where a first polymer produced from the first monomer has a different refractive index compared to the refractive index of a second polymer produced from the second monomer. The waveguide is produced by removing at least a portion of the acid-labile protecting group of the RIC polymer.

BACKGROUND OF THE INVENTION

Next generation photonic devices have ever increasing needs for accelerated methods to fabricate waveguiding elements and optical interconnects. In particular, polymer waveguides play an important role as optical interconnects facilitating incorporation of silicon photonics elements in the electronic processing framework, which is the new paradigm for fulfilling the demand on data centers and high performance computing. Hence, there is a compelling need to simplify and streamline polymer waveguide fabrication techniques which require spatial control of refractive index (RI, or n). While extensive efforts in polymer science have focused on methods to prepare optically transparent, high RI polymers, the creation of photoresponsive polymers, where the refractive index can be spatially defined in planar thin films to create refractive index contrast ($\Delta n$=difference in RI between domains) is a distinct technical challenge requiring a new class of RI-tunable materials.

SUMMARY OF THE INVENTION

Some aspects of the invention are based on development of a new class photonic polymers by the present inventors. These new class photonic polymers are referred to herein as Refractive Index Contrast (MC) Polymers.

One particular aspect of the invention provides a polymeric composition comprising a body and a waveguide, wherein said waveguide has a different refractive index compared to said body, and wherein said polymeric composition is produced from a monomeric mixture comprising:
a first monomer; and
a second monomer comprising an acid labile protecting group,
and wherein a first polymer produced from said first monomer has a refractive index that is different from a second polymer produced from said second monomer, and wherein said waveguide comprises a portion of said body where at least a portion of said acid labile protecting group has been removed.

In some embodiments, MC polymers of the invention enable modulation of refractive index (RI) in solution cast thin films with spatial control using classic photolithography tools. Still in other embodiments, RIC polymers of the invention provide a streamlined fabrication process via photolithographic writing into this polymeric medium, where large $\Delta n$ regions can be photopatterned to create low loss, polymeric waveguides at telecommunication wavelengths (e.g., 1310 and 1550 nm). Furthermore, MC polymers of the invention can be used to create a new class of optical polymers that can streamline the fabrication of polymeric waveguide devices for advanced photonic applications, such as interconnecting silicon photonics and optical networking fibers, etc.

In particular, the RIC polymers of the invention are produced from a monomeric mixture that includes a fluorinated ethylenically unsaturated monomer and a non-fluorinated ethylenically unsaturated monomer, wherein the non-fluorinated ethylenically unsaturated monomer comprises a functional group that is protected by an acid labile protecting group.

One aspect of the invention provides a polymer produced from a monomeric mixture comprising (i) from about 10% to about 90%, typically from about 10% to about 80%, often from about 20% to about 70%, more often from about 25% to about 60%, and most often from about 30% to about 50% of a fluorinated ethylenically unsaturated monomer, (ii) from about 90% to about 10%, typically from about 90% to about 20%, often from about 80% to about 30%, more often from about 75% to about 40%, and most often from about 70% to about 50% of a non-fluorinated ethylenically unsaturated monomer comprising an acid labile protecting group.

In one embodiment, said fluorinated ethylenically unsaturated monomer comprises a fluorinated methacrylate, a fluorinated acrylate, vinyl fluoride, fluorostyrene, fluorinated norbornene, fluorinated cyclic esters, fluorinated cyclic amides, fluorinated cyclic ethers, fluorinated vinyl ethers, fluorinated epoxides, fluorinated thiiranes, or a combination thereof.

Still in another embodiment, said acid labile protecting group comprises tert-butoxycarbonyl ("BOC"), a silyl ether, a t-butyl ester, tetrahydropyran (THP), tetrahydrofuran (THF), a thioester, a thiocarbonyl, tert-butyl ether, t-butyl sulfide, or a combination thereof.

Yet in another embodiment, said polymer has refractive index of from about 1.4 to about 1.7, typically from about 1.44 to about 1.65, often from about 1.45 to about 1.6, and most often from about 1.45 to about 1.56 at telecommunication wavelengths. As used herein, the term "telecommunication wavelengths" refers to electromagnetic wavelengths that are used in telecommunication, typically ranging from about 1200 nm to about 1600 nm and typically from about 1300 nm to about 1600 nm. In one particular embodiment, telecommunication wavelengths are about 1310 nm and/or about 1550 nm.

Still yet in another embodiment, said polymer has average molecular weight in the range from about 1,000 g/mole to about 1,000,000 g/mole, typically from about 1,500 g/mole to about 900,000 g/mol, often from about 2,000 g/mole to about 800,000 g/mole.

Another aspect of the invention provides a composition adapted for producing a refractive index contrast polymer for use as a waveguide, said composition comprising (i) a polymer as described herein; and a photoacid generator. As used herein, the terms "those defined above," "those defined herein," "as described herein," "as described above," "described herein," and "described above" are used interchangeably and incorporates by reference the broad definition of as well as any narrower definition(s), if any. In some embodiments, the composition further comprises a solvent.

Yet another aspect of the invention provides a method for producing an optical waveguide. The method generally includes:
  depositing (e.g., via solution processing, chemical vapor deposition, or other methods known to one skilled in the art) said composition described herein on a substrate to form a thin polymer film on a substrate; and
  photopatterning said polymer film to produce a photoexposed region and an unexposed region, wherein said photoexposed region results in removal of said acid labile protecting group, and wherein said photoexposed region has a different refractive index compared to said unexposed region resulting in said photoexposed region defining a waveguide core, thereby producing said optical waveguide.

In some embodiments, the polymer is post exposure baked (PEB) in order to prevent further removal of the acid labile protecting group.

In some embodiments, said photoexposed region has a refractive index that is higher than that of the unexposed region. In one particular embodiment, the refractive index of said photoexposed region is from about 0.003 to about 0.5, typically 0.005 to 0.2, often 0.005 to 0.1 higher than the refractive index of said unexposed region. Still in other embodiments, the refractive index of said photoexposed region is from about 0.01 to about 0.5 and often from about 0.1 to 0.2 higher than the refractive index of said unexposed region.

In one embodiment, said photopatterning step uses a mask, maskless lithography system or a direct laser writing system. In one particular embodiment, said photopatterning step comprises a maskless lithography system.

Still yet another aspect of the invention provides an optical waveguide fabricated by a method comprising:
  depositing (e.g., via solution processing, chemical vapor deposition, or other methods known to one skilled in the art) a composition described herein on a substrate to form a thin polymer film on said substrate; and
  photopatterning said polymer film to produce a photoexposed region and an unexposed region, wherein at least a portion of said acid labile protecting group is removed from said photoexposed region, and wherein removal of said acid labile protecting group results in a refractive index of said photoexposed region that is different from a refractive index of said unexposed region such that said photoexposed region forms a waveguide core thereby producing said optical waveguide.

Yet still another aspect of the invention provides. a photonic device comprising an optical waveguide described herein.

Another aspect of the invention provides a waveguide device comprising a waveguide as described herein and/or waveguide that is produced using a process described herein. In one particular embodiment, the waveguide device is an integrated splitter, coupler, arrayed waveguide grating, phase-shifter, Mach-Zehnder interferometer, directional coupler, microring resonator, mode converter, grey scale adiabatic coupler, tunable optical filter, digital optical switch, thermo-optic phase-shifter, or variable optical attenuator.

Yet another aspect of the invention provides a photonic device comprising an array of a plurality of waveguides on a substrate and an optical interconnect between said waveguides, wherein said optical interconnect is fabricated by a process comprising:
  depositing (e.g., via solution processing or other methods known to one skilled in the art) a composition described herein on said substrate to form a thin polymer film on said substrate;
  photopatterning said polymer film to produce a photoexposed region and an unexposed region, wherein at least a portion of said acid labile protecting group is removed from said photoexposed region, and wherein removal of said acid labile protecting group results in a refractive index of said photoexposed region that is higher than a refractive index of said unexposed region such that said photoexposed region forms a waveguide core thereby producing said optical interconnect between said waveguide.

DETAILED DESCRIPTION OF THE INVENTION

Figure 1:
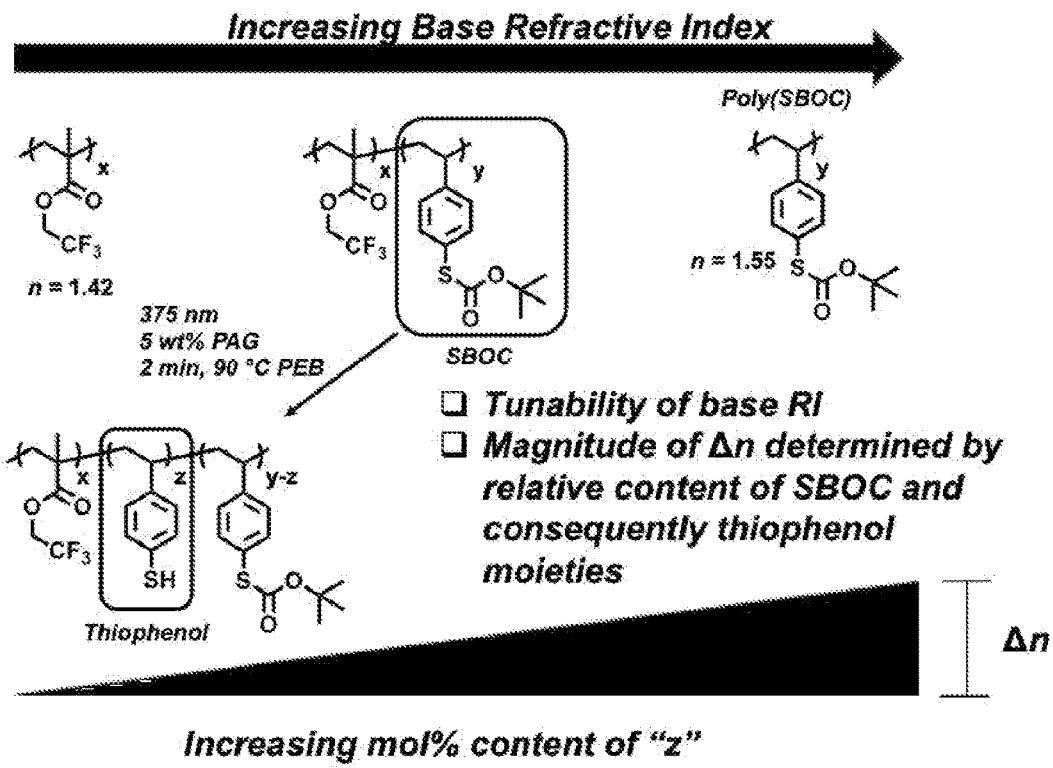
FIG. 1 illustrates one particular MC polymer of the invention and its refractive index characteristics.

Some aspects of the invention provide a polymeric composition comprising a polymeric body ("body") and a waveguide. The waveguide may be a channel that is physically formed or it may simply be an area or a "route" where a refractive index is different from the body such that an electromagnetic wave is propagated within the waveguide without a significant loss. The polymeric composition is produced from a monomeric mixture comprising a first monomer, and a second monomer comprising an acid labile protecting group. A first polymer produced from the first monomer has a refractive index that is different from a second polymer produced from the second monomer. In particular, the first polymer produced using only the first monomer has a first refractive index, n1, and the second polymer produced using only the second monomer has a second refractive index, n2, where n1≠n2. In some embodiments, n2>n1. Typically, n2 is greater than n1 in the range of from about 0.001 to about 0.5.

In some embodiments, a difference in refractive index (Δn) between said first polymer and said second polymer ranges from about 0.002 to about 0.5, typically from about 0.003 to about 0.5, and often from about 0.005 to about 0.5. In some embodiment, Δn is ranges from about 0.003 to about 0.2.

Yet in other embodiments, the refractive index (n) of said first polymer ranges from about 1.3 to about 1.6 and typically from about 1.3 to about 1.55. Yet in other embodiments, the refractive index (n) of said second polymer ranges from about 1.55 to about 1.8, typically from about 1.6 to about 1.8, and often from about 1.6 to about 1.75.

Still in other embodiments, the waveguide is formed by removing at least a portion of the acid-labile protecting group from the polymeric composition. The refractive index within the waveguide generally depends on the amount of acid-labile protecting group removed. Accordingly, the present invention provides refractive index contrast polymers in which the refractive index of the polymeric composition (e.g., base refractive index) and the refractive index of the waveguide can be modulated.

Some aspects of the invention provide RIC polymers produced from monomers comprising a fluorinated ethylenically unsaturated monomer and a non-fluorinated ethylenically unsaturated monomer comprising an acid labile protecting group. However, it should be appreciated that the scope of the invention is not limited to these particular monomers. In fact, any monomeric mixtures can be used as long as the refractive index of the first polymer produced from the first monomer is different from the refractive index of the second polymer produced from the second monomer. Another requirement of the monomeric mixture used to produce RIC polymers of the invention is that the second monomer includes an acid-labile protecting group such that the refractive index of the deprotected portion of the resulting RIC polymer is different from the refractive index of the protected portion of the RIC polymer.

Other aspects of the invention include producing RIC polymers of the invention and using RIC polymers to produce optical waveguides, interconnects, and other photonic devices and components. In one particular embodiment, RIC polymers of the invention are produced from a monomeric mixture comprising a fluorinated ethylenically unsaturated monomer, a non-fluorinated ethylenically unsaturated monomer, such as a styrenic sulfide, comprising an acid labile protecting group.

As used herein, the term "fluorinated ethylenically unsaturated monomer" refers to a compound that includes at least one carbon-carbon double bond and one or more fluoride substituents. Exemplary fluorinated ethylenically unsaturated monomers that can be used to produce RIC polymers of the invention include, but are not limited to, a fluorinated methacrylate, a fluorinated acrylate, vinyl fluoride, fluorostyrene, fluorinated norbornene, fluorinated cyclic esters, fluorinated cyclic amides, fluorinated cyclic ethers, fluorinated vinyl ethers, fluorinated epoxides, fluorinated thiiranes, and a combination thereof. It should be appreciated that the fluorinated ethylenically unsaturated monomer in the monomeric mixture can be a mixture of two or more fluorinated ethylenically unsaturated monomers.

In one particular embodiment, the amount of fluorinated ethylenically unsaturated monomer present in the monomeric mixture ranges from about 10 mol % to about 90 mol %, typically from about 20 mol % to about 80 mol %, and often from about 30 mol % to about 70 mol % relative to the total amount of the monomeric mixture. However, it should be appreciated that the scope of the invention is not limited to this particular amount of fluorinated ethylenically unsaturated monomer. When referring to a numerical value, the terms "about" and "approximately" are used interchangeably herein and refer to being within an acceptable error range for the particular value as determined by one of ordinary skill in the art, which will depend in part on how the value is measured or determined, e.g., the limitations of the measurement system, i.e., the degree of precision required for a particular purpose. For example, the term "about" typically means within 1 standard deviation, per the practice in the art. Alternatively, the term "about" can mean±20%, typically ±10%, often ±5% and more often ±1% of the numerical value. In general, however, where particular values are described in the application and claims, unless otherwise stated, the term "about" means within an acceptable error range for the particular value.

The non-fluorinated ethylenically unsaturated monomer can be same as the fluorinated ethylenically unsaturated monomer but without any fluoride substituent. Accordingly, in one embodiment, the non-fluorinated ethylenically unsaturated monomer comprises a methacrylate, an acrylate, optionally substituted ethylene, styrene, norbornene, cyclic esters, cyclic amides, and a combination thereof. As stated herein, the non-fluorinated ethylenically unsaturated monomer includes an acid labile group. Accordingly, the non-fluorinated ethylenically unsaturated monomer includes a hydroxyl (—OH) or a sulfide (—SH) group that is protected with an acid labile group. In one particular embodiment, the non-fluorinated ethylenically unsaturated monomer is a styrenic sulfide. Unless the context requires otherwise, the terms "styrenic sulfide comprising an acid labile protecting group" and "styrenic sulfide" are used interchangeably herein and refer to a compound of the formula:

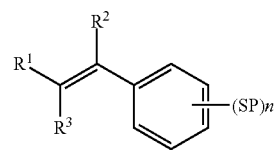

where each of $R^1$, $R^2$, and $R^3$ is independently H, $C_{1-20}$ (typically $C_{1-12}$, often $C_{1-6}$) alkyl, or a halide; n is an integer from 1 to 5, typically 1 to 3, and often 1; each P is independently H, or an acid labile protecting group, provided at least one of P is an acid labile protecting group. The term "acid labile protecting group" refers to a protecting group that are readily cleaved upon exposure to acid such as a carboxylic acid, sulfonic acid, hydrochloric acid, or other acids having pKa of about 10 or less. Typically, the acid protecting group is selected such that at least about 50%, often at least about 70%, and often at least about 80% of the acid labile protecting group is cleaved under the conditions disclosed herein. Suitable acid labile protecting groups are well known to one skilled in the art and can be found, for example, in P. G. M. Wuts, *Green's Protective Groups in Organic Synthesis*, $5^{th}$ edition, John Wiley & Sons, New York, 2014 (see also onlinelibrary.wiley.com/doi/book/10.1002/9781118905074), and *Compendium of Synthetic Organic Methods*, Vols. 1-13 (John Wiley and Sons, 1971-2014), which are incorporated herein by reference in their entirety. Representative acid labile protecting groups that are useful in the present invention include, but are not limited to, tert-butoxycarbonyl (i.e., t-BOC or BOC) and other t-butyl esters, tetrahydropyran, tetrahydrofuran, silyl ethers (e.g., trimethyl silyl ether, t-butyl dimethyl silyl ether, tri-isopropyl silyl ether, etc.), thioesters, thiocarbonyls, t-butyl ethers, t-butyl sulfides, and the like.

In one particular embodiment, the amount of non-fluorinated ethylenically unsaturated monomer comprising an acid labile protecting group present in the monomeric mixture ranges from about 90 mol % to about 10 mol %, typically from about 80 mol % to about 10 mol %, and often from about 70 mol % to about 10 mol % relative to the total amount of the monomeric mixture. However, it should be appreciated that the scope of the invention is not limited to these particular range of amounts. Moreover, non-fluorinated ethylenically unsaturated monomer in the monomeric mixture can be a mixture of two or more different non-fluorinated ethylenically unsaturated monomers. It should also be appreciated that the % mole is relative amount based on the total amount of the fluorinated ethylenically unsaturated monomer and the non-fluorinated ethylenically unsaturated monomer in the mixture. Thus, the total will always be considered to be 100%.

RIC polymers can be prepared from the monomeric mixture using any of the polymerization methods known to one skilled in the art, such as free-radical reaction, free-radical atom transfer reaction, and any controlled radical polymerization methods, which include atom transfer radical polymerization (ATRP), reversible addition fragmentation chain transfer polymerization (RAFT), nitroxide mediated polymerization, and other controlled polymerizations, which include ring opening metathesis polymerization (ROMP).

The present inventors have discovered that refractive index (n) of the RIC polymers of the invention can be modulated by varying the amount of the fluorinated ethylenically unsaturated monomer and the non-fluorinated ethylenically unsaturated monomer comprising an acid labile protecting group.

For the sake of brevity and clarity, the present invention will now be described with regard to the methods and compositions for RIC polymers that are produced from monomers comprising a fluorinated methacrylate and a styrenic sulfide comprising a t-BOC (or simply BOC) as an acid labile protecting group. However, the scope of the invention is not limited to polymers produced from these two monomers. As stated herein, RIC polymers of the invention can be a mixture of any fluorinated ethylenically unsaturated monomer and a non-fluorinated ethylenically unsaturated monomer comprising an acid labile protecting group. Discussion using a fluorinated methacrylate and a styrenic sulfide comprising a BOC protecting group is provided solely for the purpose of illustrating the practice of the invention and do not constitute limitations on the scope thereof.

In this regard, the monomers and the resulting RIC polymers along with the base refractive index of a polymer produced from a pure 2,2,2-trifluoroethylmethacrylate (n=1.42) and a polymer produced from a pure styrenic S-BOC (n=1.55) is show in FIG. 1. As can. be seen in FIG. 1, the base refractive index (n) gradually increases from n=1.42 to 1.55 as the amount of styrenic S-BOC increases from 0% to 100%. In general, one can achieve a desired refractive index of the resulting polymer by modifying the amount of a fluorinated ethylenically unsaturated monomer (e.g., 2'2'2'-trifluoroethylmethacrylate in FIG. 1) and the amount of a non-fluorinated ethylenically unsaturated monomer (e.g., SBOC in FIG. 1).

Again referring to FIG. 1, combining the MC polymer of the invention with a photoacid generator (PAG) and exposing the resulting mixture with light (e.g., 375 nm) generates acid in situ and results in removal of acid labile protecting group. Post exposure baking (PEB) of the resist film at 2 min. at 90° C. prevents further removal of acid labile protecting group. As the amount of thiophenol increases relative to the SBOC portion, the refractive index of the resulting portion of the polymer increases. Thus, the magnitude of refractive index increase (i.e., $\Delta n$) can be readily controlled by the amount of acid labile protecting group removal. In addition, the base refractive index can be tuned or modulated by varying the relative amount of the fluorinate methacrylate monomer and the styrenic sulfide.

Figure 4:
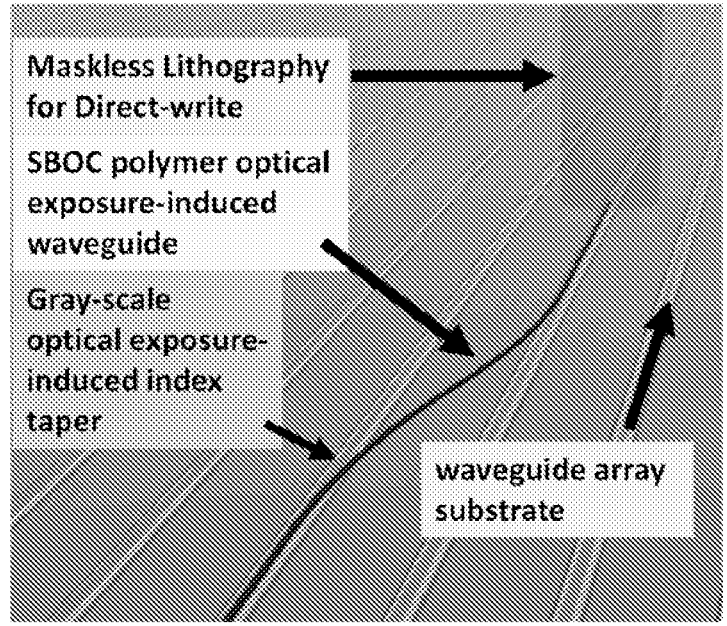
FIG. 4 is a schematic illustration of photopatterning using a maskless lithography for direct-writing to produce different RI domains of RIC polymers of the invention to create regions of high RIC.

This discovery by the present inventors to achieve a desired base refractive index of the polymer and increasing the change in the refractive index by removing a protecting group within the MC polymer of the invention allows modulation of refractive index (RI) in solution cast thin films with precise spatial control. The ability to create refractive index contrast (i.e., a difference in RI between two domains) is one of the capabilities required in photonics for the fabrication of integrated photonics devices, such as, polymer waveguides and interconnects between waveguides. One of the key advantages of the invention is that the different RI domains of RIC polymers of the invention can be photopatterned with or without mask or using a direct laser writing system (see, for example, FIG. 4) thus creating regions of high RIC. Some embodiments of the invention create a high RI core of waveguides in a single step thereby allowing rapid fabrication of photonic devices via direct laser writing. Waveguides made from RIC polymers of the invention have a very low propagation losses, typically about 1 dB/cm or less, often about 1.5 dB/cm or less, and more often about 2 dB/cm or less at 1550 nm. In other embodiments, waveguides made from RIC polymers were found to have propagation losses of about 0.4 dB/cm or less, typically about 0.75 dB/cm or less, and often about 1.25 dB/cm or less at 1310 nm.

Figure 2:
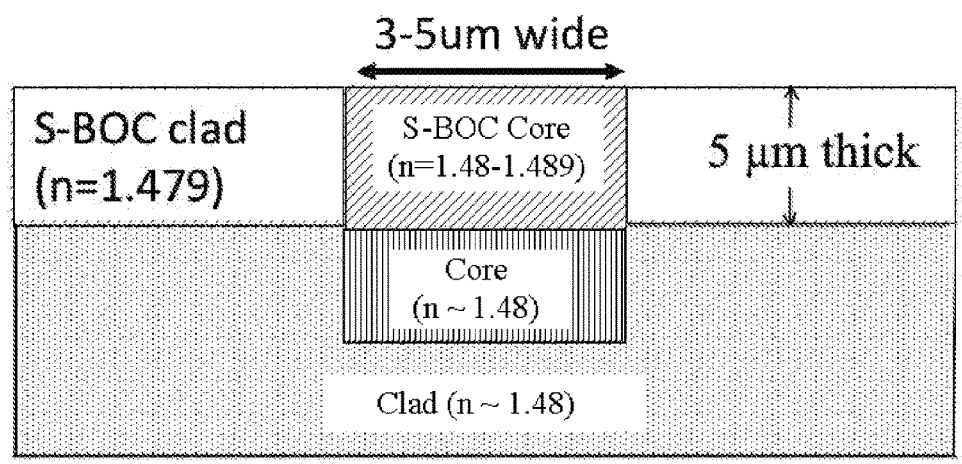
FIG. 2 is a schematic illustration of side view of the FSBOC showing indices and dimensions.
Figure 3:
FIG. 3 is a schematic illustration showing how the taper is fabricated with greyscale index values.

In one particular embodiment, free radical copolymerization of styrenic S-BOC monomers with a wide range of fluorinated (meth)acrylate monomers, e.g., (per)fluorinated (meth)acrylates, allows for the tuning of the refractive index of these polymers, with a range from 1.45 to 1.55 at telecommunication wavelengths. Furthermore, the presence of acid labile t-BOC groups allows for the use of conventional photolithographic methods to selectively photopattern thin films of these RIC polymers without the need for subsequent development or etching steps. This approach allows for a spin-on, direct-write "dry film" polymer waveguide medium, with applications in interconnecting individual silicon or silicon nitride integrated photonics chips with each other, as well as to other optical circuitries. Optical interconnections can be directly written to connect spatially separated waveguides through the use of techniques such as maskless lithography. The partially fluorinated nature of the material also leads to low optical propagation loss at telecommunications wavelengths. The photopatterning method also allows for the creation of gradient index tapers (see FIGS. 2 and 3), which can provide convenient and low-loss transport of optical signals between sets of waveguides.

As can be seen, some aspects of the invention provide a new class of photoresponsive, polymer photoresists where the refractive index of the polymer can be modulated via UV irradiation to facilitate the arbitrary writing of optical waveguides and other photonic devices in the material. The copolymer can be "spun on" to any substrate or existing photonic device architecture and, through lithography, result in direct coupling of individual waveguides, functioning as an inexpensive optical interconnect medium. The ability to transfer an optical signal between waveguide devices is critical in the formation of optical printed circuit boards, which can be faster and potentially lower cost than traditional electric printed circuit boards.

Additional objects, advantages, and novel features of this invention will become apparent to those skilled in the art upon examination of the following examples thereof, which are not intended to be limiting. In the Examples, procedures that are constructively reduced to practice are described in the present tense, and procedures that have been carried out in the laboratory are set forth in the past tense.

EXAMPLES

In a typical run, two compositions of poly(FSBOC) are prepared with either 50 or 30 mol % SBOC feed ratios relative to 2,2,2-trifluoroethyl acrylate, and an overall degree of polymerization of 200 targeted. The experimental procedure for a 50 mol % loading of SBOC was as follows: a 25 mL schlenk flask equipped with a magnetic stir bar was charged with SBOC (6.25 g, 26.50 mmol) and 2,2,2-trifluoroethyl acrylate (3.77 mL, 26.50 mmol). Separately, in a 20 mL vial, the RAFT chain transfer agent (CTA) 2-cyano-2-propyl dodecyl trithiocarbonate (36.55 mg, 0.1059 mmol) and 2,2'-azobis(2-methylpropionitrile) (8.7 mg, 0.0530 mmol) were dissolved in toluene (8.5 mL) then added to the schlenk flask. The flask was sealed with a rubber septum and the solution was degassed by bubbling argon gas through the mixture for 10 minutes. The reaction vessel was placed in a 70° C. thermostated oil bath and this temperature was maintained with stirring for 24 hours. The reaction was quenched by exposure to air and diluted with chloroform after an aliquot had been removed to calculate conversion. The poly(FSBOC) was precipitated by addition to a large excess of chilled methanol and the off white/yellow powder collected via vacuum filtration and dried under vacuum. Typical molecular weights ranged from 54,800 to 64,900 g/mol. In a clean room, the dried poly(FSBOC) was dissolved in a 1:9 mixture of 1,1,1,3,3,3-hexafluoro-2-propanol:propylene glycol monomethyl ether acetate to afford a 40 wt/v % solution. To this solution was added the photoacid generator ("PAG") (4-phenylthiophenyl)diphenylsulfonium triflate at 5 wt/wt % relative to the amount of poly(FSBOC). This procedure was repeated for the poly(FSBOC) prepared with a lower mol % of SBOC units and a solution in 1,1,1,3,3,3-hexafluoro-2-propanol/propylene glycol monomethyl ether acetate prepared with the same relative loading of photoacid generator. The solutions were titrated together until the desired refractive index was achieved.

Spin on Optical Interconnects With Fluorinated RIC Copolymers on Waveguide Arrays: The substrate with pre-fabricated waveguide arrays is suspended and sonicated in acetone for 5 minutes immediately followed by sonication in IPA for 5 minutes then blown dry with N2. The clean substrate has FSBOC spun on to get a film thickness of 5 um (spin speed is dependent on the viscosity of the batch). After spinning the sample is baked at 90° C. for 2 minutes. The sample is then loaded into the MLA150 for patterning. Each grey level has a separate layer to allow for different doses. All layers are aligned to the same points such that the tapers are directly centered on the waveguides below. There are 15 blocks of equal size that make up the taper design. The minimum taper dose is 50 mJ/cm2. After the final taper block, the S-bends are aligned and printed using the maximum dose of 2000 mJ/cm$^2$. After exposure, the sample is baked for 2 minutes at 90° C. to complete the fabrication.

Results of various experiments using waveguides and interconnects produced from RIC polymers of the invention are shown in FIGS. 5-9B.

Figure 5:
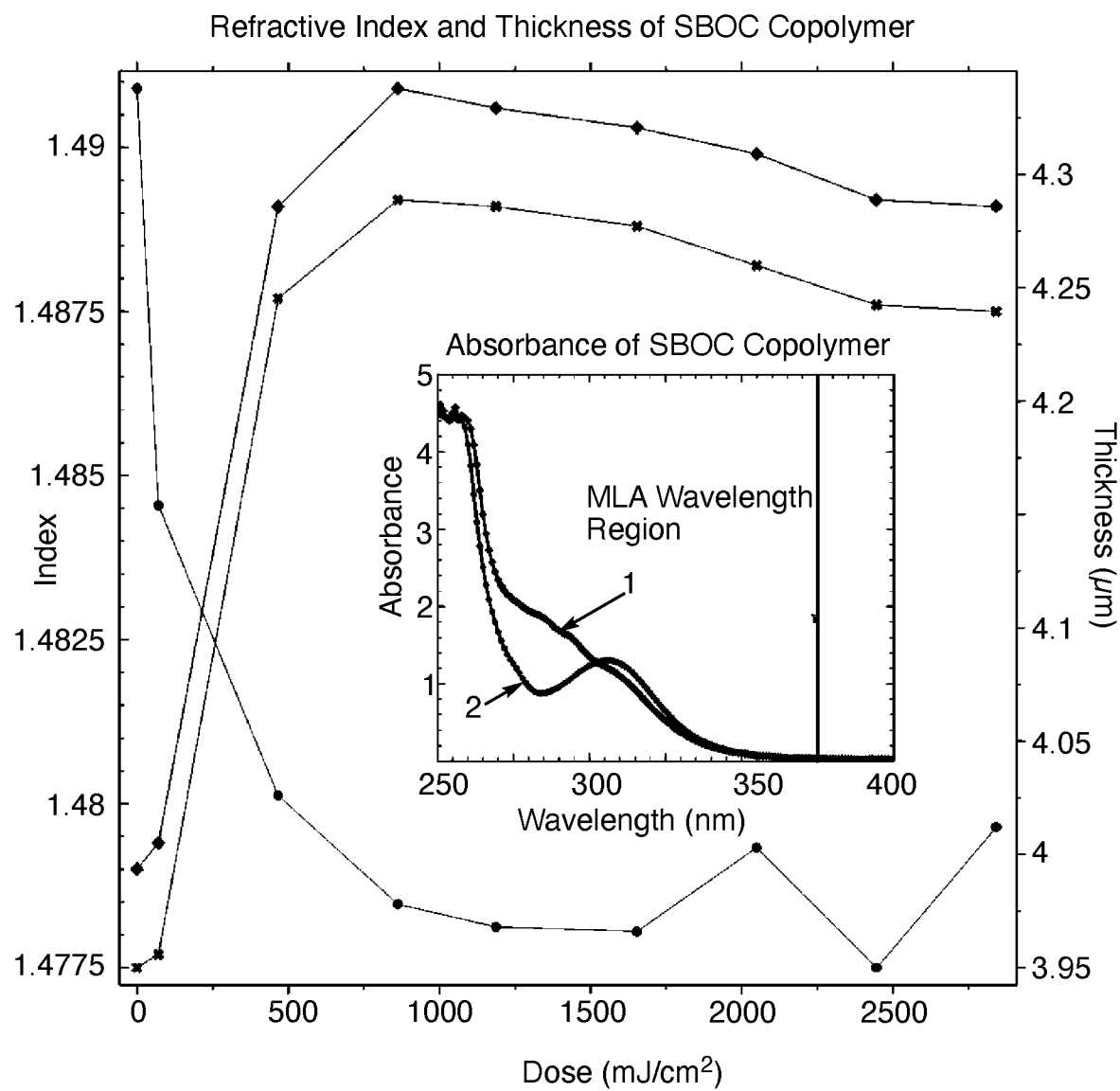
FIG. 5 is a plot showing the refractive index relative to the thickness of SBOC-FSBOC copolymer. The diamond is the refractive index at 1310 nm, "x" is the refractive index at 1550 nm, and the circle is thickness of the polymer. Inset shows absorbance of FSBOC, where arrow 1 is as spun and arrow 2 is deprotected to show absorption at MLA wavelength region.

In particular, FIG. 5 is a plot showing the refractive index and thickness of FSBOC. The diamond is the refractive index at 1310 nm, "x" is the refractive index at 1550 nm, circle is the thickness of the SBOC copolymer. Inset shows absorbance of FSBOC, where arrow 1 is as spun and arrow 2 is deprotected to show absorption at MLA wavelength region. The refractive index was measured at 1550 nm and 1310 nm using a Metricon prism coupler, with the thickness measured with a Dektak surface profilometer. As can be seen in FIG. 5, as the refractive index increases, there is also a decrease in SBOC copolymer thickness. These measurements were taken on a silicon substrate but corrected for the reflection of the exposing MLA laser radiation at 375 nm. The gradual refractive index change with exposure allows for the tapers to be written with greyscale. The absorbance was measured on CARY UV-VIS spectrophotometer. Two (2) samples were prepared: one as spun, one thermally deprotected by baking at 200° C. for 10 min. The absorbance plot shows that the polymer itself does not absorb the MLA wavelength. FIG. 5 also shows the relationship between index and dose. If the polymer did absorb strongly at 375 nm then it would be expected that the effective dose at the bottom of the film would be different than at the top.

Figure 6:
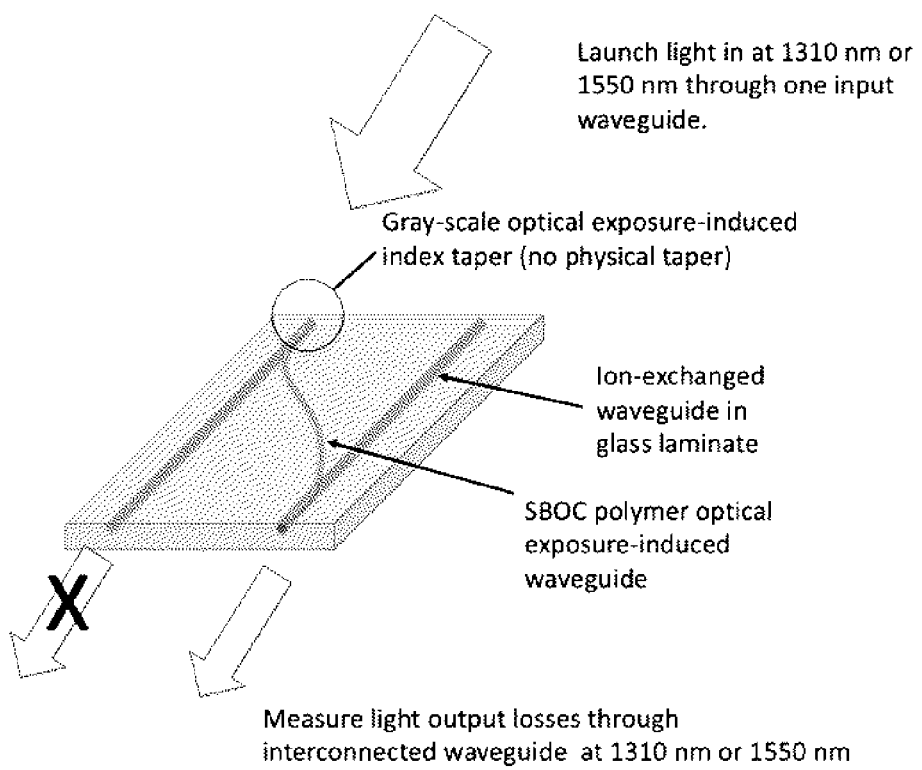
FIG. 6 a schematic illustration of a transmission of an electromagnetic radiation through one input waveguide and light output through interconnected waveguide using a MC polymer of the invention.

FIG. 6 a schematic illustration of a transmission of an electromagnetic radiation through one input waveguide and light output through interconnected waveguide using a RIC polymer of the invention. A substrate having two parallel IOX-waveguides in glass laminate was covered with a film of RIC polymer of the invention. Briefly, FS-BOC was spun onto 6 μm of SiO$_2$ on Si with a target thickness of 5 μm to approximately match what was fabricated on IOX and exposed at 2000 mJ/cm$^2$ to interconnect two IOX waveguides. Telecommunication wavelength (e.g., 1310 nm and 1550 nm) was transmitted through an input of the substrate through one of the two parallel IOX-waveguides. Light output losses were measured through interconnected waveguide. Measurements were performed using the cutback method; a single-mode SMF-28 fiber was used to launch light into the FS-BOC waveguide and a lens was used to capture the light emerging from the waveguide on the other end of the sample.

Figure 7A:
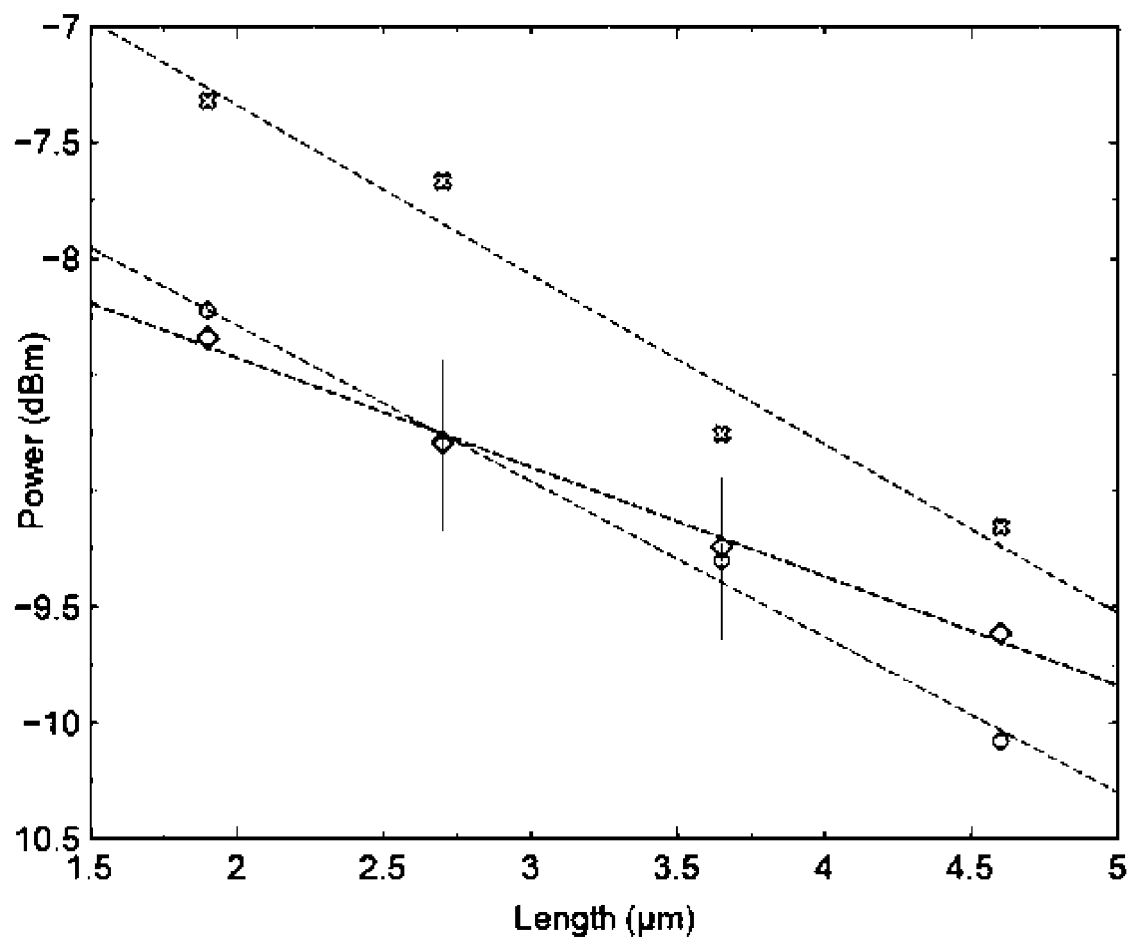
FIG. 7A shows graphs cutback data for SBOC copolymer at 1310 nm.
Figure 7B:
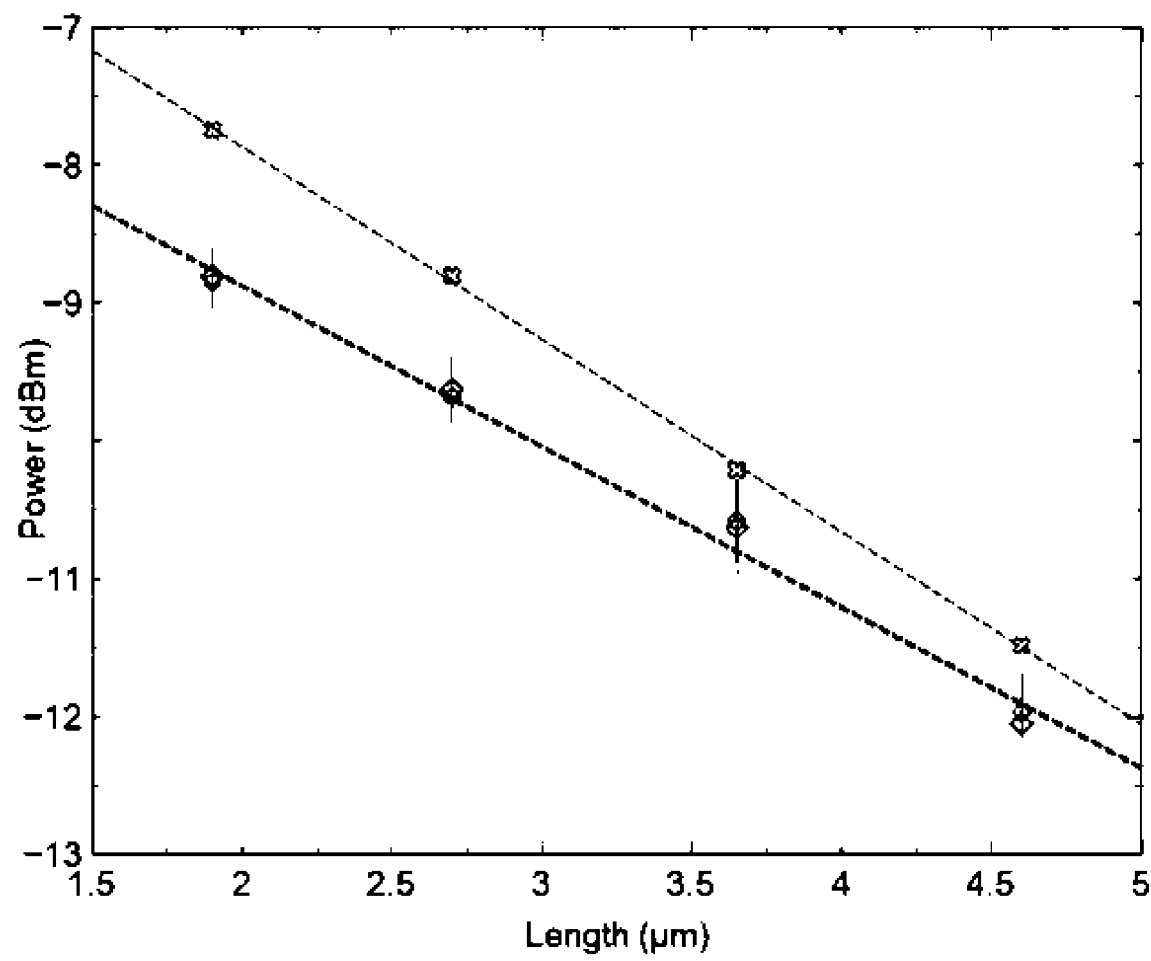
FIG. 7B shows graphs cutback data for SBOC copolymer at 1550 nm.

FIG. 7A shows graphs cutback data for SBOC copolymer at 1310 nm. Circle indicate a 3 μm wide waveguide, diamond is 4 μm wide, and "x" is 5 μm wide. At 1310 nm: 3 μm wide waveguide propagation loss is 0.67 dB/cm, while for 4 μm wide it is 0.47 dB/cm, and for 5 μm wide it is 0.69 dB/cm. FIG. 7B shows graphs cutback data for SBOC copolymer at 1550 nm using the same procedure described for FIG. 7A. Circle indicate a 3 μm wide waveguide, diamond is 4 μm wide, and "x" is 5 μm wide. At 1550 mm: the propagation loss values are 1.14 dB/cm at 3 μm width, 1.19 dB/cm at 4 μm, and 1.39 dB/cm at 5 μm. Without being bound by any theory, it is believed that the propagation loss is lower at 1310 nm compared to at 1550 nm due to reduced contribution from molecular vibration overtone absorption.

Figure 8A:
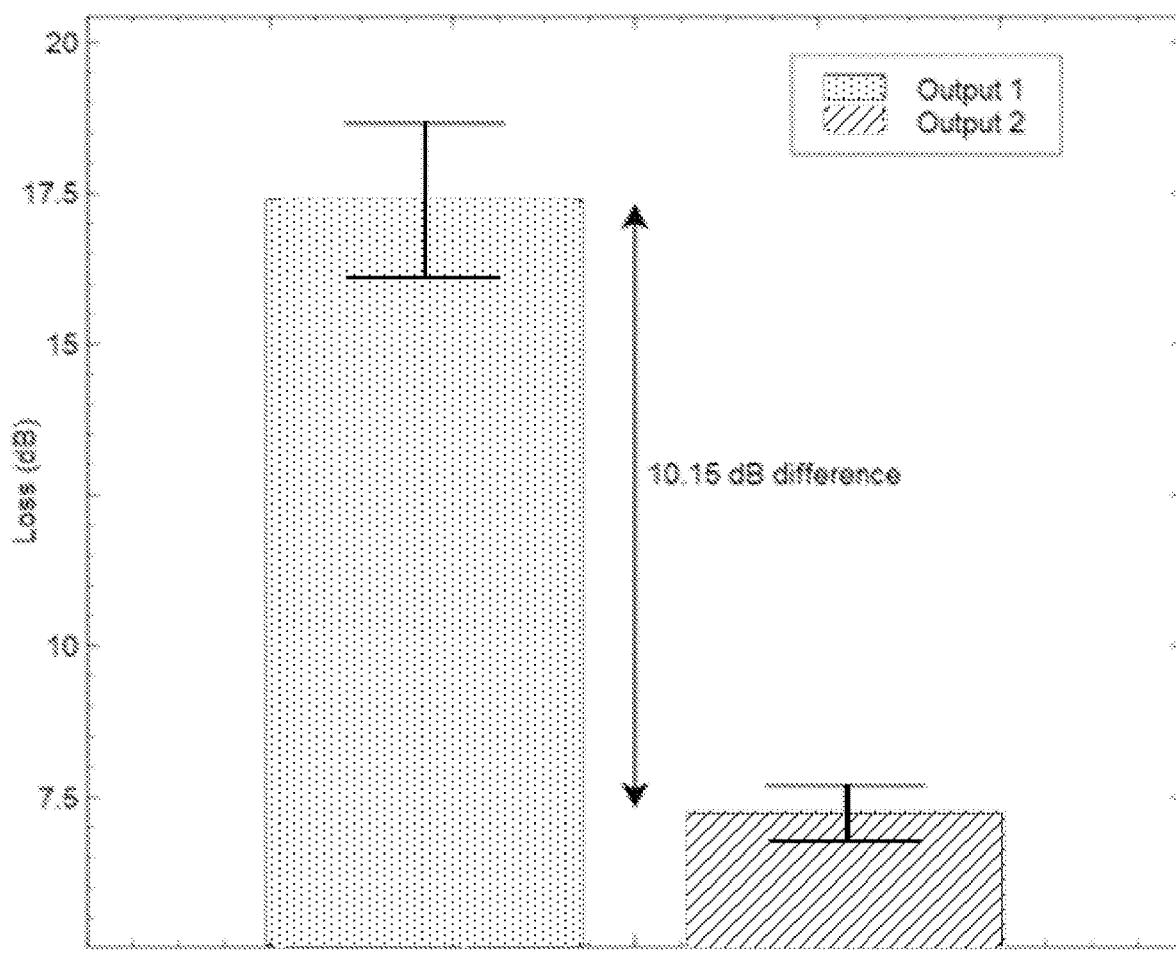
FIG. 8A shows a bar graph for repeat measurements at 1310 nm.
Figure 8B:
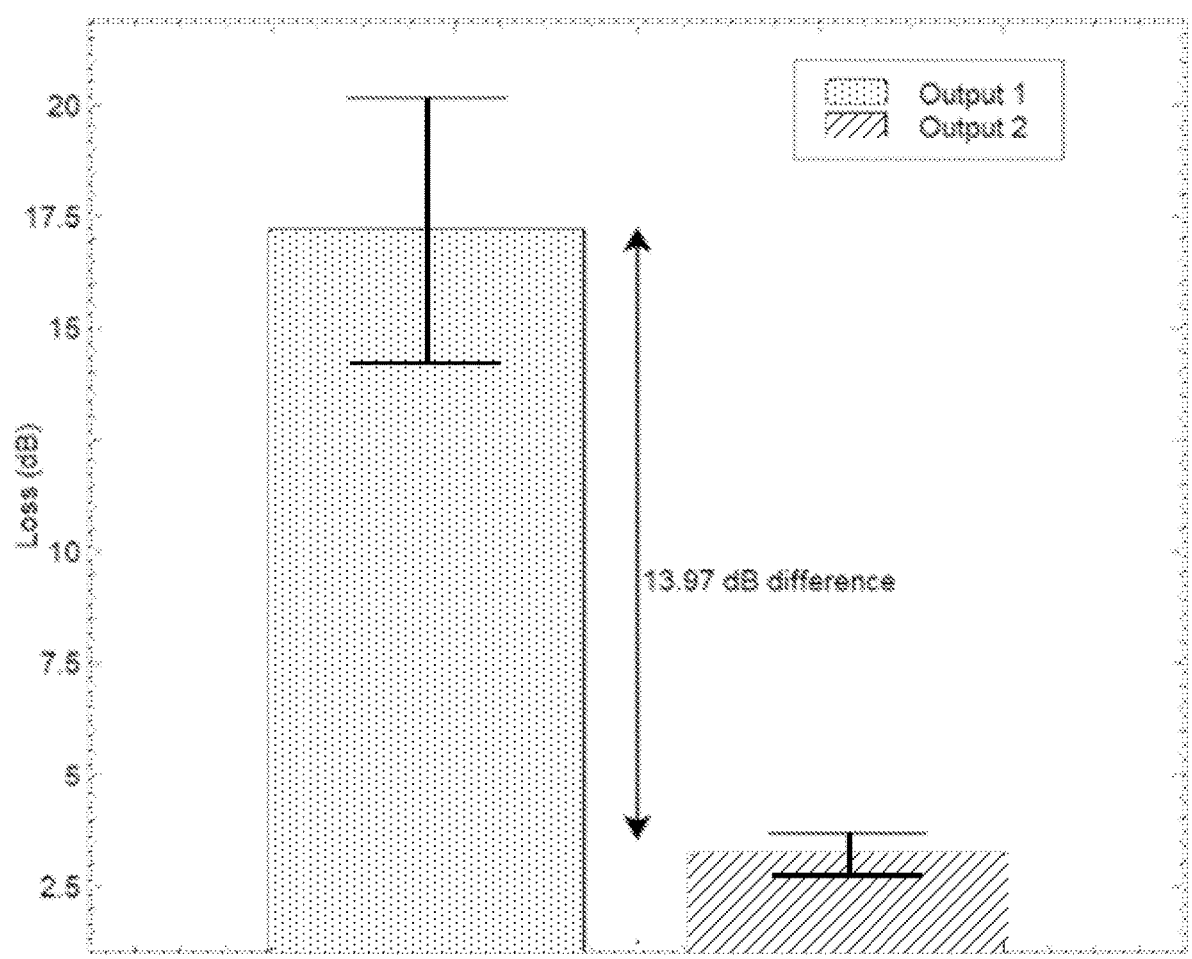
FIG. 8B shows a bar graph for repeat measurements at 1550 nm.

FIGS. 8A and 8B show bar graphs for repeat measurements at 1310 nm and 1550 nm, respectively. For 1310 nm, output 1 (launch waveguide) loss is 17.39 dB+/−1.26 dB, output 2 (destination waveguide) loss is 7.24 dB+/−0.447 dB, with their difference being 10.15 dB. For 1550 nm, the output 1 (launch waveguide) loss is 17.2 dB+/−2.945 dB, output 2 loss is 3.23 dB+/−0.453 dB, with their difference being 13.97 dB. For these measurements, 7 identical tapers were measured: all 3 μm wide with 2 mm tapers and 17 mm S-bend. The measured output powers are corrected for the input power background power as well as the estimated propagation loss based on the cutback measurements. The resulting values are then averaged to get the numbers presented in the figure. This figure provides strong experimental evidence that the tapers work reproducibly and have low loss. The S-bends measured fiber-to-fiber with index matching oil used at the fiber/waveguide interface. The launch waveguide is the waveguide where the input light is directed by an SMF-28 fiber, while the destination waveguide is where the light is coupled by the FS-BOC waveguide after the S-bend.

Figure 9A:
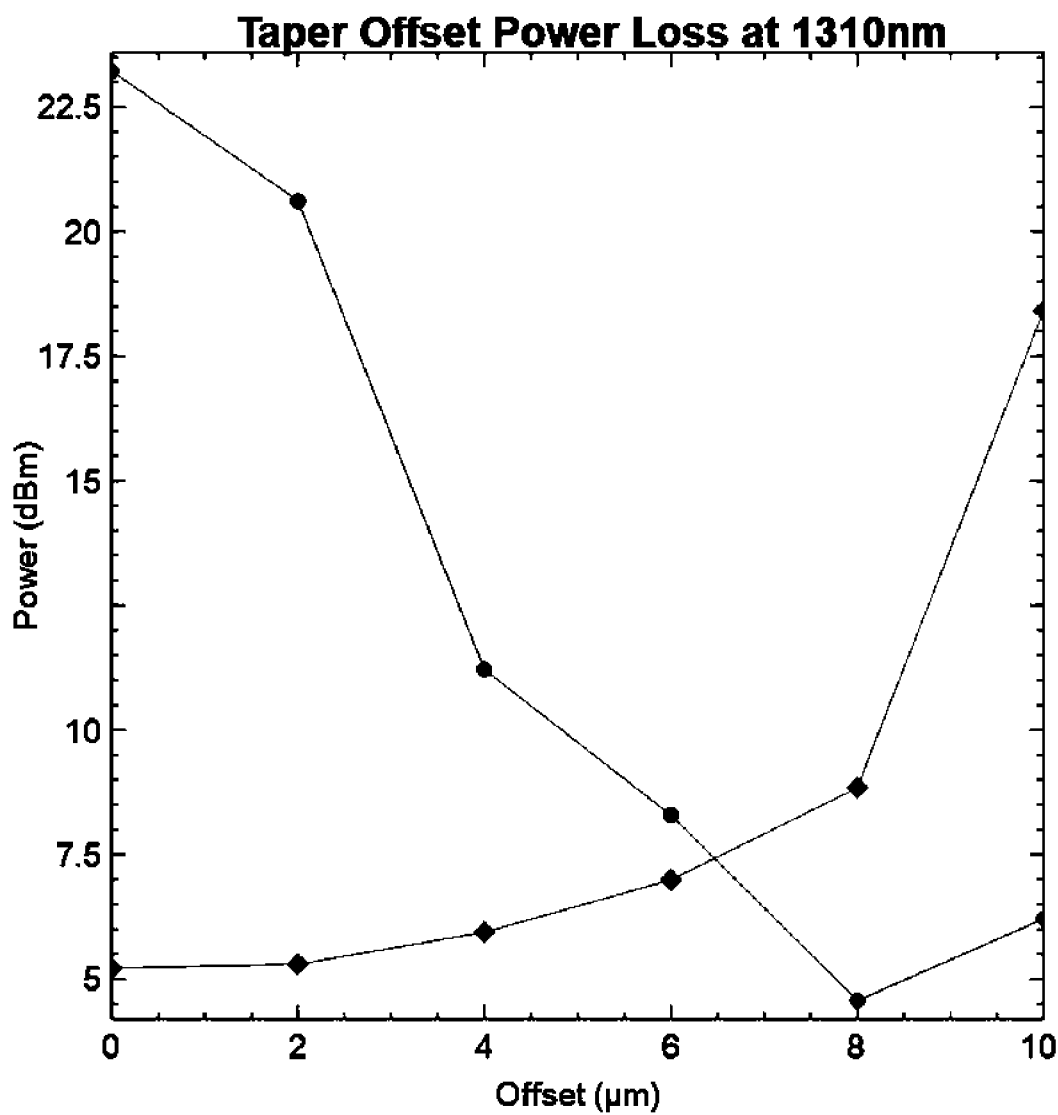
FIG. 9A shows plot of taper offset power loss at 1310 nm.
Figure 9B:
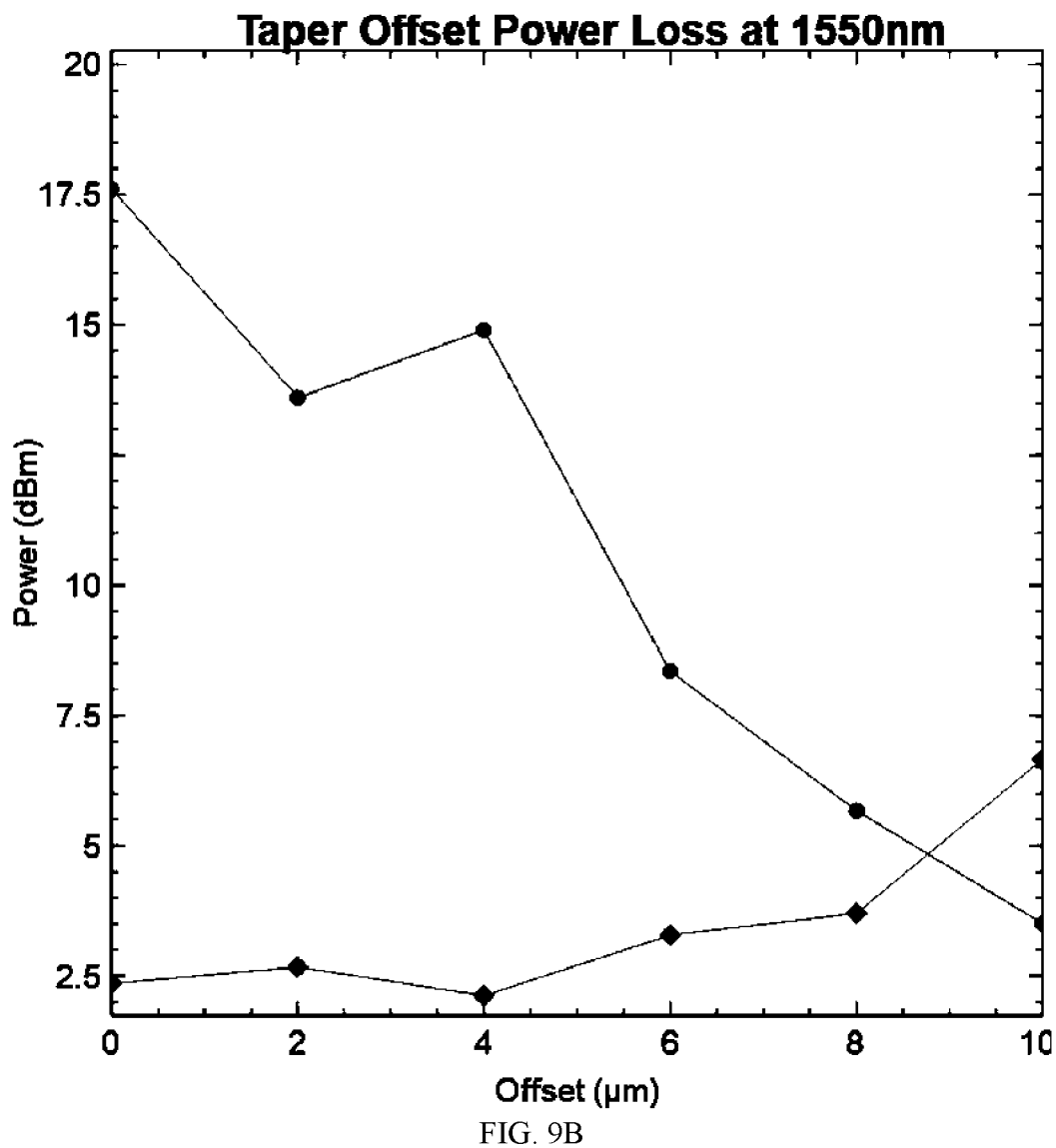
FIG. 9B shows plot of taper offset power loss at 1550 nm.

FIGS. 9A and 9B show plot of taper offset power loss at 1310 nm and 1550 nm, respectively. The FS-BOC waveguides were fabricated on IOX glass with an offset from nominally perfect alignment of 2-10 μm in steps of 2 μm. The offset occurs at the input end of the chip and the waveguide crosses roughly perpendicularly over the IOX launch waveguide in the S-bend. The output taper is aligned to the center of the destination IOX waveguide. All tapers are 3 μm wide and 2 mm long. The S-bends are all 17 mm long. Background power measurement is subtracted out as well as propagation loss. Circle is the output power from the launch IOX waveguide; Diamond is output power from the destination IOX waveguide. All measurements were performed fiber-to-fiber (SMF-28) with index matching oil. Increasing the offset causes more power to stay in the launch IOX waveguide. The plot clearly shows misalignment tolerance.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter. All references cited herein are incorporated by reference in their entirety.

What is claimed is:

1. A polymeric composition comprising a body and a waveguide, wherein said waveguide has a different refractive index compared to said body, and wherein said polymeric composition is produced from a monomeric mixture comprising:

from about 10 mol % to about 90 mol % of a first monomer comprising fluorinated ethylenically unsaturated monomer; and from about 90 mol % to about 10 mol % of a second monomer comprising non-fluorinated ethylenically unsaturated monomer, the non-fluorinated ethylenically unsaturated monomer comprising an acid labile protecting group, and wherein a first polymer produced from said first monomer has a refractive index that is different from a second polymer produced from said second monomer, and wherein said waveguide comprises a portion of said body where at least a portion of said acid labile protecting group has been removed.

2. The polymeric composition of claim 1, wherein a difference in refractive index (Δn) between said first polymer and said second polymer ranges from about 0.002 to about 0.5.

3. The polymeric composition of claim 1, wherein the refractive index (n) of said first polymer ranges from about 1.3 to about 1.6.

4. The polymeric composition of claim 1, wherein the refractive index (n) of said second polymer ranges from about 1.55 to about 1.8.

5. A polymer produced from a monomeric mixture comprising from about 10 mol % to about 90 mol % of a fluorinated ethylenically unsaturated monomer and from about 90 mol % to about 10 mol % of a non-fluorinated ethylenically unsaturated monomer comprising an acid labile protecting group.

6. The polymer of claim 5, wherein said fluorinated ethylenically unsaturated monomer comprises a fluorinated methacrylate, a fluorinated acrylate, vinyl fluoride, fluorostyrene, fluorinated norbornene, fluorinated cyclic esters, fluorinated cyclic amides, fluorinated cyclic ethers, fluorinated vinyl ethers, fluorinated epoxides, fluorinated thiiranes, or a combination thereof.

7. The polymer of claim 5, wherein said acid labile protecting group comprises tert-butoxycarbonyl ("BOC"), a silyl ether, a t-butyl ester, tetrahydropyran (THP), tetrahydrofuran (THF), a thioester, a thiocarbonyl, tert-butyl ether, t-butyl sulfide, or a combination thereof.

8. The polymer of claim 5, wherein said polymer has refractive index of from about 1.44 to about 1.65 at telecommunication wavelengths.

9. The polymer of claim 5, wherein said polymer has average molecular weight in the range from about 1,000 g/mole to about 1,000,000 g/mole.

10. A composition adapted for producing a refractive index contrast polymer for use as a waveguide, said composition comprising:

a polymer of claim 5; and a photoacid generator.

11. The composition of claim 10 further comprising a solvent.

12. A method for producing an optical waveguide, said method comprising:

depositing a composition comprising a polymer and a photoacid generator to form a thin polymer film on a substrate, wherein the polymer is produced from a monomeric mixture comprising from about 10 mol % to about 90 mol % of a fluorinated ethylenically unsaturated monomer and from about 90 mol % to about 10 mol % of a non-fluorinated ethylenically unsaturated monomer comprising an acid labile protecting group; and photopatterning said polymer film to produce a photoexposed region and an unexposed region, wherein said photoexposed region results in removal of said acid labile protecting group, and wherein said photoexposed region has a different refractive index compared to said unexposed region resulting in said photoexposed region defining a waveguide core, thereby producing said optical waveguide.

13. The method of claim 12, wherein said photoexposed region has a refractive index that is higher than that of the unexposed region.

14. The method of claim 12, wherein the refractive index of said photoexposed region is from about 0.003 to about 0.5 higher than the refractive index of said unexposed region.

15. The method of claim 12, wherein said photopatterning step uses a mask, maskless lithography system, or a direct laser writing system.

16. The method of claim 12, wherein said photopatterning step comprises a maskless lithography system.

17. An optical waveguide fabricated by the method of claim 12.

18. A photonic device comprising an optical waveguide of claim 17.

19. A waveguide device comprising a waveguide of claim 17.

20. The waveguide device of claim 19, wherein said waveguide device is an integrated splitter, coupler, arrayed waveguide grating, phase-shifter, Mach-Zehnder interferometer, directional coupler, microring resonator, mode converter, grey scale adiabatic coupler, tunable optical filter, digital optical switch, thermo-optic phase-shifter, or variable optical attenuator.

* * * * *